United States Patent [19]

Nagashima

[11] 4,302,501
[45] Nov. 24, 1981

[54] POROUS, HEAT RESISTANT INSULATING SUBSTRATES FOR USE IN PRINTED CIRCUIT BOARDS, PRINTED CIRCUIT BOARDS UTILIZING THE SAME AND METHOD OF MANUFACTURING INSULATING SUBSTRATES AND PRINTED CIRCUIT BOARDS

[76] Inventor: Koreyuki Nagashima, 3-10, Koenji-Kita 2-chome, Suginami-ku, Tokyo, Japan

[21] Appl. No.: 913,879

[22] Filed: Jun. 8, 1978

Related U.S. Application Data

[63] Continuation of Ser. No. 752,329, Dec. 20, 1976, abandoned.

[30] Foreign Application Priority Data

Dec. 24, 1975 [JP] Japan .................................. 52/154300

[51] Int. Cl.² .......................... B32B 5/26; B32B 5/28; B32B 5/32; H05K 1/00

[52] U.S. Cl. ................................. 428/304; 156/634; 174/68.5; 428/316; 428/317; 428/318; 428/337; 428/339; 428/901; 156/305; 156/307.1; 156/307.7

[58] Field of Search ............... 428/304, 316, 317, 318, 428/337, 339, 901; 174/68.5; 156/634, 306

[56] References Cited

U.S. PATENT DOCUMENTS 2,547,022  4/1951  Leno ............................... 339/278 C Primary Examiner—James C. Cannon
Attorney, Agent, or Firm—Charles E. Pfund

[57] ABSTRACT

The insulating substrate comprises an insulating sheet made of cellulose material and a prepreg impregnated with a thermosetting resin and bonded to at least one surface of the insulating substrate. A printed circuit board is prepared by forming electric conductors arranged in a predetermined circuit pattern on the surface of the prepreg.

15 Claims, 6 Drawing Figures

4,302,501

POROUS, HEAT RESISTANT INSULATING SUBSTRATES FOR USE IN PRINTED CIRCUIT BOARDS, PRINTED CIRCUIT BOARDS UTILIZING THE SAME AND METHOD OF MANUFACTURING INSULATING SUBSTRATES AND PRINTED CIRCUIT BOARDS

This is a continuation of application Ser. No. 752,329 filed Dec. 20, 1976, and now abandoned.

BACKGROUND OF THE INVENTION

This invention relates to an insulating substrate for use as a printed circuit board utilized in various electric devices and electronic devices and a method of manufacturing a printed circuit board utilizing the insulating substrate.

An insulating substrate impregnated with phenolic resin, for example, is generally used as the insulating substrate for preparing a printed circuit board. Such substrate is prepared by impregnating an insulating sheet such as a sheet of craft paper or a glass cloth with a thermosetting resin such as a phenolic resin varnish and then laminating a plurality of resin impregnated insulating sheet (generally called a prepreg), heat-curing the lamination by a hot press, and then cooling the cured lamination under pressure.

Such insulating substrates are now widely used to prepare printed circuit boards, but they have a detrimental disadvantage that their manufacturing cost is high. Yet the insulating substrates have been used because they have a number of characteristics suitable for manufacturing printed circuit boards.

I have found that the high manufacturing cost is caused by the following reasons.

First reason is that, the prepreg is manufactured by the steps of impregnating a sheet of craft paper or a glass cloth with a thermosetting resin, and then drying the impregnated sheet. These steps increase with manufacturing cost because the thermosetting resin is expensive and because impregnation and drying require a long time and trouble.

Another reason is that a number of such expensive prepregs are laminated. More particularly, a prepreg generally has a thickness of 0.2 mm, so that it is necessary to laminate 8 prepregs in order to obtain an insulating substrate having a thickness of 1.6 mm. Accordingly, the cost of the prepregs occupies a substantial percentage of the manufacturing cost of the resulting insulating substrate.

Further, where such insulating substrate is used to prepare a printed circuit board there are the following problems.

For example, to apply solder to the conductors on a printed circuit board, the insulating substrate is heated to a temperature of about 260° C. so that the gas contained in the insulating substrate is caused to expand by the heat of soldering on the impregnated liquid remaining in the substrate evaporates, expands and breaks out between the insulating substrate and the conductors printed thereon, thus causing blistering and deformation of the printed circuit board. In order to avoid this difficulty it is necessary to complete the soldering operation in a short time.

Further, the printed circuit board is often provided with perforations by punching. However, as the prior art insulating substrate is made up of only prepregs it has a large Young's modulus with the result that cracks and fractures are formed at the time of punching. For this reason, usually the punching operation is performed by decreasing the Young's modulus by heating the substrate to a temperature of 60° C. to 150° C.

SUMMARY OF THE INVENTION

It is an object of this invention to provide an insulating substrate which is cheaper than the prior art insulating substrate.

Another object of this invention is to decrease the manufacturing cost of an insulating substrate without sacrifying its characteristics necessary for use as a printed circuit board.

Still another object of this invention is to provide a method of manufacturing an insulating substrate capable of producing by simple process steps.

A further object of this invention is to provide a cheap printed circuit board capable of withstanding heat of soldering.

Still further object of this invention is to provide a printed circuit board capable of punching at low temperatures.

Another object of this invention is to provide a method of manufacturing a printed circuit board by simple steps and at a low cost.

According to one aspect of this invention there is provided an insulating substrate for use as a printed circuit board comprising an insulating sheet which contains cellulose material as the essential component thereof, and a prepreg bonded to at least one surface of the insulating sheet.

According to another aspect of this invention, there is provided a method of manufacturing an insulating substrate for use as a printed circuit board comprising the steps of superposing a prepreg impregnated with a thermosetting resin on at least one surface of an insulating sheet containing cellulose material as the essential component thereof, and applying heat and pressure to the resulting assembly thereby curing the thermosetting resin and bonding the prepreg to the insulating sheet.

According to still another feature of this invention there is provided a printed circuit board comprising an insulating substrate made up of an insulating sheet containing cellulose material as the essential component thereof and at least one prepreg bonded to at least one surface of the insulating sheet, and electric conductors arranged in a predetermined circuit pattern on the surface of the prepreg.

According to a further aspect of this invention there is provided a method of manufacturing a printed circuit board comprising the steps of superposing a prepreg impregnated with a thermosetting resin on at least one surface of an insulating sheet containing cellulose material as the essential component thereof, applying heat and pressure to the resulting assembly to cure the thermosetting resin and to bond the prepreg to the insulating sheet thereby forming an insulating substrate, and forming on the surface of the prepreg electric conductors which are arranged in a predetermined circuit pattern.

BRIEF DESCRIPTION OF THE DRAWINGS

Further objects and advantages of the invention can be more fully understood from the following detailed description taken in conjunction with the accompanying drawings in which.

DESCRIPTION OF THE PREFERRED EMBODIMENTS

Figure 1:
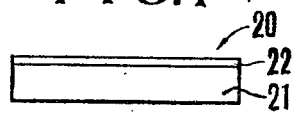
FIG. 1 is a side view showing one example of an insulating substrate embodying the invention.

FIG. 1 shows one example of the insulating substrate of this invention for use as a printed circuit board. The insulating substrate 20 shown therein comprises a sheet of cellulose insulator 21 and a suitable number (in this example one) of prepreg 22 superposed upon the cellulose insulator 21. The insulating sheet is made of cellulose material so that it is porous, and may be made of a hardboard, a plywood, a paper board or the like which may consist of natural or artificial fibers. The thickness of the insulating sheet 21 is from 1 to 5 mm, for example. The prepreg 22 may be purchased from market or prepared by the maker of the insulating substrate and comprises a thin sheet impregnated with a semicured thermosetting resin. Usually, the prepreg comprises a sheet of craft paper or glass cloth impregnated with a resol type phenolic resin varnish, diallyl phthalate resin, polyester resin, melamine resin or epoxide resin and has a thickness of from 0.01 to 0.3 mm, preferably 0.2 mm.

With this construction it is possible to decrease the number of prepregs 22 necessary to produce an insulating substrate 20 having a desired thickness. Moreover, as the insulating sheet 21 is made of inexpensive cellulose material the manufacturing cost of the insulating substrate is much lower than that of the prior art insulating substrate which was manufactured by laminating a plurality of prepregs. For example, to prepare an insulating substrate having a thickness of 1.6 mm by the prior art method it is necessary to use 8 prepregs whereas in accordance with this invention only one prepreg is sufficient when it is combined with an insulating sheet having a thickness of 1.4 mm. For this reason, according to this invention it is possible to reduce the cost of manufacturing an insulating substrate having a prescribed thickness because the number of expensive prepreg can be reduced. Although, in the above example, one prepreg was used it will be clear that the number of the prepregs may be increased, if necessary.

Figure 2:
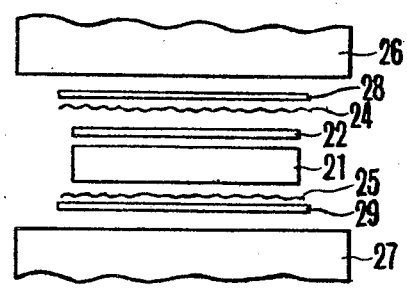
FIG. 2 is a side view showing one example of the pressing step for manufacturing the insulating substrate shown in FIG. 1.

The insulating substrate 20 shown in FIG. 1 is prepared by the pressing step as shown in FIG. 2. More particularly, a single prepreg 22 having a thickness of 0.2 mm and impregnated with a resol type phenolic resin is superposed upon one surface of a cellulose type insulating sheet 21 having a thickness of 1.4 mm. Then, the opposite surfaces of the assembly is covered by synthetic resin sheets 24 and 25. Alternatively, the assembly may be packed with a single synthetic resin sheet. The purpose of using the synthetic resin sheets is to readily release the assembly from the metal platens 26 and 27 after press curing. In the example shown in FIG. 2, platen 26 is movable in the vertical direction whereas platen 27 is stationary. Metal inserts 28 and 29 are interposed between the movable platen 26 and the synthetic resin sheet 24 and between the stationary platen 27 and the synthetic resin sheet 25, respectively. These metal inserts are used for the purpose of making flat the synthetic resin sheets 24 and 25 and may be made of stainless steel, for example.

After arranging the various elements as above described, the assembly is heat-cured for 20 minutes at a temperature of 150° C. by the press, and then cooled under pressure. After cooling the resulting insulating substrate is removed from the press for preparing a printed circuit board. Table 1 below compares various characteristics of the insulating substrate of this invention and a prior art substrate comprising only laminated prepregs each comprising a sheet of paper impregnated with a phenolic resin.

TABLE 1

| Characteristics | Substrate This Invention | Prior Art |
|---|---|---|
| thickness (mm) | 1.6 | 1.6 |
| bending strength (kg/mm$^2$) | 10 | 11 |
| insulating resistance (ohm) | $5 \times 10^{10}$ | $4 \times 10^{11}$ |
| moisture absorption (%) | 5 | 1.5 |
| deflection (mm) | 10 | 3 |
| heat resistance (°C.) | 115 | 130 |

These results were obtained by the measurement according to the provision of the Japanese Industrial Standard JIS C-6481. As can be noted from Table 1, although the insulating substrate of this invention comprising a sheet of cellulose and a single prepreg having a thickness of 0.2 mm and bonded to one surface of the cellulose sheet has characteristics a little inferior than those of the prior art insulating substrate its manufacturing cost is less than ⅓ of that of the prior art.

Figure 3:
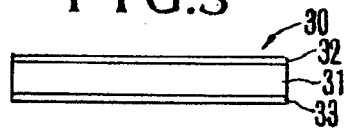
FIG. 3 is a side view showing a modified embodiment of the insulating substrate of this invention.

FIG. 3 shows a modified embodiment of this invention in which an insulating substrate 30 comprises a cellulose sheet 31 and prepregs 32 and 33 bonded on both sides of the cellulose sheet. Although, in this example only one prepreg is applied to each side of the cellulose sheet, the number of prepregs may be increased. The materials from which the cellulose sheet and the prepregs are made are the same as those used in the previous embodiment.

Figure 4:
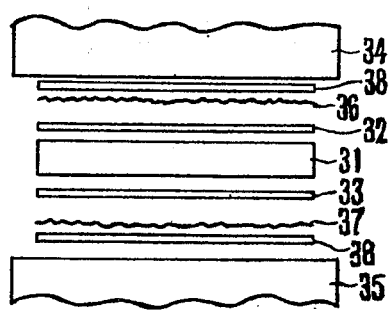
FIG. 4 is a side view similar to FIG. 2 showing one example of the pressing step for manufacturing the insulating substrate shown in FIG. 3.

FIG. 4 shows one example of preparing the insulating substrate 30 shown in FIG. 3. Thus, a single prepreg impregnated with resol type phenolic resin and having a thickness of 0.2 mm is applied to each side of a cellulose type insulating sheet 31 having a thickness of 1.2 mm and the assembly is interposed between movable and stationary platens 34 and 35 together with synthetic resin sheets 36 and 37 and metal inserts 38 and 39 in the same manner as in FIG. 2.

Table 2 below compares the characteristics of the resulting insulating substrate and a prior art insulating substrate comprising only laminated prepregs made of sheets of paper impregnated with a phenolic resin.

TABLE 2

| Characteristics | Substrate This Invention | Prior Art |
|---|---|---|
| thickness (mm) | 1.6 | 1.6 |
| bending strength (kg/mm$^2$) | 10.5 | 11 |
| insulating resistance (ohm) | $3 \times 10^{11}$ | $4 \times 10^{11}$ |
| moisture absorption (%) | 2.0 | 1.5 |
| deflection (mm) | 3 | 3 |
| heat resistance (°C.) | 130 | 130 |

These characteristics were obtained by the same method as in Table 1. Table 2 shows that the insulating substrate 30 of this embodiment has characteristics comparable with those of the prior art. Moreover, as the insulating substrate is much cheaper than the prior art insulating substrate because inexpensive cellulose sheet is used as the main insulating material. Instead of phenolic resin, diallyl phthalate resin, polyester resin, melamine resin or epoxy resin can also be used but phenolic resin and diallyl phthalate resin are preferred in view of their excellent heat resistance property.

Figure 5:
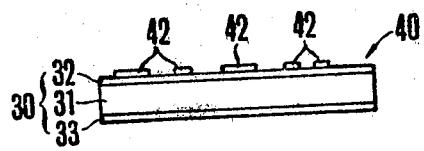
FIG. 5 is a side view showing one example of a printed circuit board utilizing the insulating substrate shown in FIG. 3

FIG. 5 shows one example of a printed circuit board 40 utilizing the insulating substrate 30 shown in FIG. 3, wherein conductors 42, for example copper foils, are formed on one surface of the insulating substrate to form a predetermined circuit pattern.

The printed circuit board has improved resistance to the heat of soldering. More particularly, when the insulating substrate is heated to about 260° C. at the time of soldering, the gas evolved by the substrate can readily escape to the surrounding atmosphere because the insulating sheet 31 is porous, thereby greatly decreasing blistering caused by the gas entering between the insulating substrate and the conductors formed thereon as in the prior art construction. Accordingly, it is also possible to prevent deformation of the printed circuit board due to emitted gas, whereby it is possible to apply solder over a longer time.

Where perforations are formed through the printed circuit board by punching since the thickness of the prepregs impregnated with a thermosetting resin is small (less than ¼ in this example) with respect to the total thickness of the insulating substrate and moreover since the insulating sheet comprising the major portion of the substrate is made of porous cellulose material and hence softer than the prepregs, the Young's modulus is decreased thus making it possible to readily perforate even at room temperature.

Figure 6:
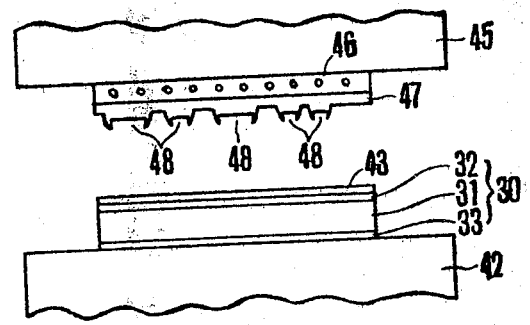
FIG. 6 is a side view showing the pressing step for manufacturing the printed circuit board shown in FIG. 5.

The printed circuit board shown in FIG. 5 can be prepared by the method and apparatus as shown in FIG. 6. At first, on both sides of a cellulose insulating sheet 31 having a thickness of about 1.7 mm, for example, are superposed prepregs 32 and 33 impregnated with a resol type phenolic resin and the laminated assembly is mounted on the stationary platen 42 of a press. Then a conductor 43, for example a copper foil, having a thickness of 35 microns and coated by a bonding agent of the phenolic resin type is placed on the surface of the insulating substrate 30.

The movable platen 45 of the press is provided with a stamping die 47 containing a suitable heating means such as an electric heater 46. Knives 48 having a pattern corresponding to the desired circuit pattern are formed on the surface of the stamping die 42 facing the stationary platen.

In the operation of the press, the stamping die 47 is heated to a temperature of about 130° C. by the heater 46 and then the movable platen 45 is lowered thus stamping the copper foil 43 by the knives 48 thereby removing the portions of the copper foils other than the circuit conductors thereby forming a printed circuit. Thereafter the assembly is press-cured for about 10 minutes at a temperature of 150° C. thereby completing the printed circuit board 40 as shown in FIG. 5.

Another method of preparing a printed circuit board by using the insulating substrate 30 shown in FIG. 3 is as follows. At first, a prepreg impregnated with a resol type phenolic resin and having a thickness of 0.2 mm is laminated on each side of a cellulose sheet having a thickness of about 1.5 mm, and the assembly is pressed to obtain an insulating substrate as shown in FIG. 5. A copper foil having a thickness of 35 microns and coated with a binder of the phenolic resin type is mounted on the insulating substrate and the assembly is heat-cured under pressure thus forming a lamination provided with a copper layer. The copper layer is photoetched to obtain a printed circuit board having conductors of a desired circuit pattern. Table 3 shows various characteristics of the printed circuit boards prepared by the various method described above.

TABLE 3

| Characteristics of the Printed Circuit Boards | | | |
| --- | --- | --- | --- |
| | Printed circuit board | | |
| Characteristics | This invention (etching method) | This invention (die stamping) | Prior art (die stamping) |
| Bonding strength of the conductors (kg/cm$^2$) | 1.9 | 2.1 | 2.1 |
| Insulation resistance between conductors spaced 1.7 mm, (ohm) | 8 × 10$^9$ | 4 × 10$^{10}$ | 5 × 10$^{10}$ |
| Heat resistance to solder at 260° C. (sec) | 30 | 90 | 16 |
| Deflection (mm) | 1.0 | 0.8 | 0.6 |

These characteristics were measured according to the provision of JIS C-6481, except that insulation resistance between conductors was measured according to SAEJ-771b. This table shows that the bonding strength of the conductors and the insulation resistance between conductors of the printed circuit boards embodying the invention are comparable with those of the prior art printed circuit board comprising only the prepregs impregnated with a phenolic resin whereas the resistance to soldering heat is higher than that of the prior art. This is caused by the use of an insulating substrate whose major portion comprises an insulating sheet of cellulose material. This material is porous so that any gas evolved in the substrate during soldering can readily escape to the atmosphere through the insulating sheet. This advantage is remarkable in the printed circuit board of this invention prepared by die stamping technique.

Further, the printed circuit board of this invention can be readily perforated at lower temperatures than the prior art printed circuit board, for example at room temperature. It was found that this workability increases with the thickness of the printed circuit board.

A printed circuit board having substantially the same characteristics as those of the printed circuit boards described above which use prepregs impregnated with phenolic resin can also be obtained by bonding prepregs impregnated with diallyl phthalate resin on both sides of a hard board. Table 4 below compares the characteristics of the printed circuit board of this invention utilizing prepregs impregnated with diallyl phthalate resin and those of the prior art printed circuit board utilizing prepregs impregnated with phenolic resin.

TABLE 4

Characteristics of Printed Circuit Board

| Characteristics | Printed circuit board | | |
|---|---|---|---|
| | This invention (etching method) | This invention (die stamping) | Prior art (die stamping) |
| Bonding strength of the conductors ($kg/cm^2$) | 1.9 | 2.1 | 2.1 |
| Insulation resistance between conductors spaced 1.7 mm (ohm) | $9 \times 10^9$ | $5 \times 10^{10}$ | $5 \times 10^{10}$ |
| Heat resistance to solder at 260° C. (sec) | 30 | 110 | 16 |
| Deflection (mm) | 1.0 | 0.8 | 0.6 |

The invention is not limited to the specific embodiments described above and various modifications are possible. For example, where the insulating substrate is not required to withstand the heat of soldering such resins as urea resin, vinyl acetate resin, or amino alkyd resin can be substituted for phenolic resin for impregnating the prepreg. Alternatively, a heat resistance prepreg may be bonded on one side of an insulating substrate where printed circuit is to be formed whereas a prepreg which is not required to have sufficient heat resistance may be bonded to the other surface of the insulating substrate. This modification is free from deflection or warping. Accordingly, a prepreg having a relatively low heat resistance and bonded to the surface of the substrate opposite to the surface on which a printed circuit is formed functions to prevent deflection.

What is claimed is:

1. An insulating substrate for use as a printed circuit board comprising a porous insulating sheet which contains cellulose material as the essential component thereof, and a a resin impregnated insulating sheet bonded to at least one surface of the porous insulating sheet, said porous insulating sheet being sufficiently porous to allow gas evolved in said substrate during soldering to readily escape through said porous insulating sheet, said insulating substrate providing a printed circuit board formed therefrom with heat resistance to solder at 260° C. for at least 30 seconds and thus avoid blistering of said printed circuit board.

2. The insulating substrate according to claim 1 wherein said insulating sheet comprises a hardboard.

3. The insulating substrate according to claim 1 wherein said insulating sheet comprises a plywood.

4. The insulating substrate according to claim 1 wherein said insulating sheet comprises a paper board.

5. A printed circuit board comprising an insulating substrate made up of a porous insulating sheet containing cellulose material as the essential component thereof and at least one resin impregnated insulating sheet bonded to at least one surface of said porous insulating sheet, and electric conductors arranged in a predetermined circuit pattern on the surface of said prepreg, said porous insulating sheet being sufficiently porous to allow gas evolved in said substrate during soldering to readily escape through said porous insulating sheet, said insulating substrate providing a printed circuit board formed therefrom with heat resistance to solder at 260° C. for at least 30 seconds and thus avoid blistering of said printed circuit board.

6. The printed circuit board according to claim 5 wherein said insulating sheet comprises a hardboard.

7. The printed circuit board according to claim 5 wherein said insulating circuit board comprises a plywood.

8. The printed circuit board according to claim 5 wherein said insulating sheet comprises a paper board.

9. The printed circuit board according to claim 5 wherein said prepreg comprises a sheet of fibrous material impregnated with a thermosetting resin.

10. A printed circuit board according to claim 5 which further comprises a deflection preventing layer bonded to the other surface of said insulating substrate.

11. An insulating substrate for use as a printed circuit board comprising a porous insulating sheet that contains cellulose material as the essential component thereof, said porous insulating sheet being from 1 to 5 mm thick, and one resin impregnated insulating sheet bonded to at least one surface of the porous insulating sheet, said porous insulating sheet being sufficiently porous to allow gas evolved in said substrate during soldering to readily escape through said porous insulating sheet, said insulating substrate providing a printed circuit board formed therefrom with heat resistance to solder at 260° C. for at least 30 seconds and thus avoid blistering of said printed circuit board.

12. The insulating substrate of claim 11 wherein each surface of said porous insulating sheet has bonded thereto one resin impregnated insulating sheet.

13. A printed circuit board comprising the insulating substrate of claims 11 or 12 and electric conductors arranged in a predetermined circuit pattern on the exposed surface of said resin impregnated insulating sheet.

14. A method of manufacturing an insulating substrate for use as a printed circuit board comprising the steps of superposing a prepreg impregnated with a thermosetting resin on at least one surface of a porous insulating sheet containing cellulose material as the essential component thereof, said insulating sheet being sufficiently porous to allow gas evolved in said substrate during soldering to readily escape through said insulating sheet, and applying heat and pressure to the resulting assembly thereby curing said thermosetting resin and bonding said prepreg to said insulating sheet, and thereby forming an insulating substrate that provides a printed circuit board made therefrom with heat resistance to solder at 260° C. for at least 30 seconds and thus avoid blistering of said printed circuit board.

15. A method of manufacturing a printed circuit board comprising the steps of superposing a prepreg impregnated with a thermosetting resin on at least one surface of a porous insulating sheet containing cellulose material as the essential component thereof, said insulating sheet being sufficiently porous to allow gas evolved in said substrate during soldering to readily escape through said insulating applying heat and pressure to the resulting assembly to cure the thermosetting resin and to bond the prepreg to said insulating sheet thereby forming an insulating substrate, and forming on the surface of said prepreg electric conductors which are arranged in a predetermined circuit pattern, thereby obtaining a printed circuit board having heat resistance to solder at 260° C. for at least 30 seconds and thus avoid blistering of said printed circuit board.

* * * * *